(12) United States Patent
Singasani

(10) Patent No.: US 8,191,024 B2
(45) Date of Patent: May 29, 2012

(54) CUSTOMIZABLE H-TREE SYNTHESIS TOOL

(75) Inventor: Chandrasekhar Singasani, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 370 days.

(21) Appl. No.: 12/404,623

(22) Filed: Mar. 16, 2009

(65) Prior Publication Data

US 2010/0235802 A1  Sep. 16, 2010

(51) Int. Cl.
*G06F 17/50* (2006.01)

(52) U.S. Cl. ........ 716/111; 716/113; 716/114; 716/129; 716/130; 716/122; 716/123; 703/16

(58) Field of Classification Search .................. 716/111, 716/113, 114, 129, 130, 122, 123; 703/16
See application file for complete search history.

(56) References Cited

U.S. PATENT DOCUMENTS

| | | | | |
|---|---|---|---|---|
| 5,452,239 | A * | 9/1995 | Dai et al. | 703/19 |
| 6,006,025 | A * | 12/1999 | Cook et al. | 716/113 |
| 6,698,006 | B1 | 2/2004 | Srinivasan | |
| 6,721,931 | B2 | 4/2004 | Richling et al. | |
| 7,418,689 | B2 * | 8/2008 | Habitz et al. | 716/130 |
| 7,823,115 | B2 * | 10/2010 | Habitz et al. | 716/130 |
| 7,865,861 | B2 * | 1/2011 | Habitz et al. | 716/130 |
| 2003/0149950 | A1 | 8/2003 | Richling | |
| 2005/0251775 | A1 * | 11/2005 | Wood | 716/10 |
| 2006/0248488 | A1 * | 11/2006 | Habitz et al. | 716/10 |
| 2007/0220466 | A1 * | 9/2007 | Davidovic | 716/6 |
| 2007/0226659 | A1 * | 9/2007 | Suaya et al. | 716/1 |
| 2008/0195993 | A1 * | 8/2008 | Habitz et al. | 716/14 |
| 2008/0201683 | A1 * | 8/2008 | Habitz et al. | 716/14 |
| 2009/0019407 | A1 * | 1/2009 | Matsui | 716/5 |

OTHER PUBLICATIONS

International Search Report—PCT/ US2010/027448, International Search Authority—European Patent Office May 27, 2010.
Written Opinion—PCT/ US2010/027448, International Search Authority—European Patent Office May 27, 2010.
Lipman J: "Growing Your Own IC Clock Tree" EDN Electrical Design News, Reed Business Information, Highlands Ranch, CO, US, vol. 42, No. 6, Mar. 14, 1997, pp. 40-46,48, XP000695232, ISSN: 0012-7515.

(Continued)

*Primary Examiner* — Phallaka Kik
(74) *Attorney, Agent, or Firm* — Sam Talpalatsky; Nicholas J. Pauley; Jonathan T. Velasco

(57) ABSTRACT

A computer program for generating an H-tree for an integrated circuit design stored on a computer readable medium includes code to receive from a user a set of parameters to configure the H-tree. The parameters include a starting segment length and an ending segment length. The computer program also includes code to select a starting location in the integrated circuit design. The computer program further includes code to place an anchor H at the starting location. The computer program further includes code to recursively place child Hs on the H-tree based on the starting segment length and the ending segment length to create a fan-out with equal weight on each child H. The number of levels of the H-tree is calculated according to a rounded down integer equal to a binary logarithm of a quotient of the starting segment length divided by the ending length.

26 Claims, 8 Drawing Sheets

OTHER PUBLICATIONS

Mohamed Nekili et al: "Pipelined H-Trees for High-Speed Clocking of Large Integrated Systems in Presence of Process Variations" IEEE Transactions on Very Large Scale Integration (VLSI) Systems, IEEE Service Center, Piscataway, NJ, US, vol. 5, No. 2, Jun. 1, 1997, XP011063291, ISSN: 1063-8210.

International Search Report & Written Opinion—PCT/US2010/027448, International Search Authority—European Patent Office—May 27, 2010.

Lipman J: "Growing Your Own IC Clock Tree" EDN Electrical Design News, Reed Business Information, Highlands Ranch, CO, US, vol. 42, No. 6, Mar. 14, 1997, pp. 40-46,48, XP000695232 ISSN: 0012-7515.

Mohamed Nekili et al: "Pipelined H-Trees for High-Speed Clocking of Large Integrated Systems in Presence of Process Variations" IEEE Transactions on Very Large Scale Integration (VLSI) Systems, IEEE Service Center, Piscataway, NJ, US, vol. 5, No. 2, Jun. 1, 1997, XP011063291 ISSN: 1063-8210.

* cited by examiner

CUSTOMIZABLE H-TREE SYNTHESIS TOOL

TECHNICAL FIELD

The present disclosure generally relates to integrated circuits (ICs). More specifically, the present disclosure relates to application-specific integrated circuits (ASICs) and distributing clock signals within ASICs.

BACKGROUND

Integrated circuits (ICs) have become an integral part of nearly all electronic devices today. Advantages to using ICs generally include low power consumption and low profiles that have made devices significantly more portable than previous generations of devices. ICs may include a combination of logic circuitry and memory devices that make up familiar devices such as microprocessors and random access memory. The microprocessors in personal computers (PCs) are general purpose devices that can perform a number of diverse tasks. However, many electronic devices perform very specific functions and do not need a general purpose microprocessor.

Application-specific integrated circuits (ASICs) are integrated circuits designed to perform specific tasks. ASICs may be found in a wide range of devices including, for example, cellular telephones, automobiles, or alarm clocks. ASICs are made up of cells that perform smaller tasks that when connected together accomplish the desired function of the ASIC. The cells include register cells for processing data and memory cells for storing data. Because all of the cells cooperate with each other the cells must be synchronized. Synchronization is accomplished by distributing a clock signal to all of the cells.

The clock signal repeats a cycle including a voltage rise, referred to as a rising edge, followed by a voltage drop, referred to as a falling edge. The rising and falling edges are detected by the cells and used to time events throughout all of the cells in an ASIC. These events include, for example, some cells placing information on a data bus and other cells latching onto information on a data bus. If the clock signal does not arrive at all of the cells at substantially similar times, the cells will fail to operate as desired. For example, if the clock signal arrives at a first cell latching onto a data bus before the clock signal arrives at a second cell placing data on the data bus, the first cell will not obtain correct data because it will try to obtain data that has not been placed on the data bus. As a result the cell and possibly the entire ASIC will not function properly. The time for the clock signal to propagate from a root, or insertion point for the clock signal, to each cell is referred to as an insertion delay.

The clock signal is distributed over a clock tree to the cells. In this sense, the clock tree is the backbone of ASIC design. One problem with the clock signal is that the clock signal does not arrive at all cells at identical times because the length of wire or interconnect between different cells and the clock root are not identical. The propagation time of the clock signal through the wire or interconnect is finite and therefore the clock signal takes different amounts of time to reach each cell depending on the length of the wire or interconnect leading to each cell.

An additional problem lies in skew of the clock signal. As the clock signal propagates through the clock tree, the rising edges and falling edges become less sharp resulting in a larger skew of the clock signal. A low skew is important for the cells to detect the rising and falling edges of the clock signal. Over an extended distance, the clock signal can experience large skew and appear to be a continuously variable signal rather than a signal with two discrete values. As a result, the cells do not function at proper times within an ASIC.

Synthesis tools are developed to assist ASIC designers to ensure the clock signal reaches each cell of an ASIC at substantially identical times. The designer begins by laying out cells for an ASIC. The synthesis tool then lays out a clock tree design that reduces skew to an acceptable level as input by the designer. The synthesis tool also optimizes the clock tree design to ensure that each cell in an ASIC receives the clock signal at substantially identical times within an acceptable limit as input by the designer.

One technique previous synthesis tools have used is to strategically place buffers along the clock tree to act as delays. The buffers are also placed to reduce skew in the clock signal by reducing the load on each buffer. The load on each buffer is determined by the length of wire or interconnect between buffers because the capacitance of the wire or interconnect is proportional to its length. Additional buffers are placed along the clock tree to delay the propagation of the clock signal. However, this technique is unable to meet the clock skew and clock timing requirements of new ASIC designs.

Another technique uses an H-tree to place buffers along the clock tree in a symmetric fashion. When the buffers are arranged symmetrically the length of wire or interconnect between cells in the ASIC is substantially identical. As a result, the cells experience similar insertion delays and clock skew. Current clock tree synthesis tools are capable of designing H-trees. However, they lack the capability of specifying the length of the interconnect between the insertion point and the cells.

In ASIC designs, the H-trees achieve good clock skew. Without knowledge of how a tool creates an H-tree design, however, current tools might not give satisfactory H-tree design results. If the H-tree synthesis could be customized, the user would have more flexibility to create a satisfactory H-tree design.

Therefore, a new technique for generating clock trees in ASICs is needed that produces low skew and similar insertion delay for each of the cells and allows design flexibility.

BRIEF SUMMARY

According to one aspect of the disclosure, a computer program for generating an H-tree for an integrated circuit design is stored on a computer readable medium and includes code to receive from a user a set of parameters to configure the H-tree. The parameters include a starting segment length and an ending segment length. The computer program also includes code to select a starting location in the integrated circuit. The computer program further includes code to place an anchor H at the starting location.

According to another aspect of the disclosure, a computerized method of generating an H-tree for an integrated circuit includes receiving from a user a set of parameters to configure the H-tree. The parameters include a starting segment length and an ending segment length. The computer program also includes placing an anchor H at a starting location according to the starting segment length. The computer program further includes recursively placing child Hs according to the starting segment length and ending segment length to create a fan-out with equal weight on each child H.

According to yet another aspect of the disclosure, a computerized method of generating an H-tree for an integrated circuit includes the step of receiving from a user a set of parameters to configure the H-tree. The parameters include a starting segment length and an ending segment length. The computer program also includes the step of placing an anchor H at a starting location according to the starting segment length. The computer program further includes the step of recursively placing child Hs according to the starting segment length and ending segment length to create a fan-out with equal weight on each child H.

The foregoing has outlined rather broadly the features and technical advantages of the present invention in order that the detailed description that follows may be better understood. Additional features and advantages will be described hereinafter that form the subject of the claims of the invention. It should be appreciated by those skilled in the art that the conception and specific embodiments disclosed may be readily utilized as a basis for modifying or designing other structures for carrying out the same purposes of the present invention. It should also be realized by those skilled in the art that such equivalent constructions do not depart from the technology of the invention as set forth in the appended claims. The novel features that are believed to be characteristic of the invention, both as to its organization and method of operation, together with further objects and advantages will be better understood from the following description when considered in connection with the accompanying figures. It is to be expressly understood, however, that each of the figures is provided for the purpose of illustration and description only and is not intended as a definition of the limits of the present invention.

BRIEF DESCRIPTION OF THE DRAWINGS

For a more complete understanding of the present invention, reference is now made to the following description taken in conjunction with the accompanying drawings.

DETAILED DESCRIPTION

One method for laying out a clock tree for an ASIC design is using an H-tree. An H-tree design ensures an equal length from the clock root to all leafs of the tree. The H-tree synthesis tool as described below designs the H-tree and allows the designer to configure the H-tree according to a start and end segment length. Conventionally, the start and end segment lengths are not chosen by the designer. Instead, the synthesis tool chooses the design parameters to minimize clock skew. The clock synthesis tool will also automatically insert buffers in the H-tree and create a net list corresponding to the buffers.

One advantage to specifying the H-tree starting segment length and ending segment length is the ability to calculate the clock tree cap in advance of circuit design. Knowing the span of the tree and the number of levels a clock insertion delay may be calculated for planning circuit operation such as timing requirements.

Figure 1:
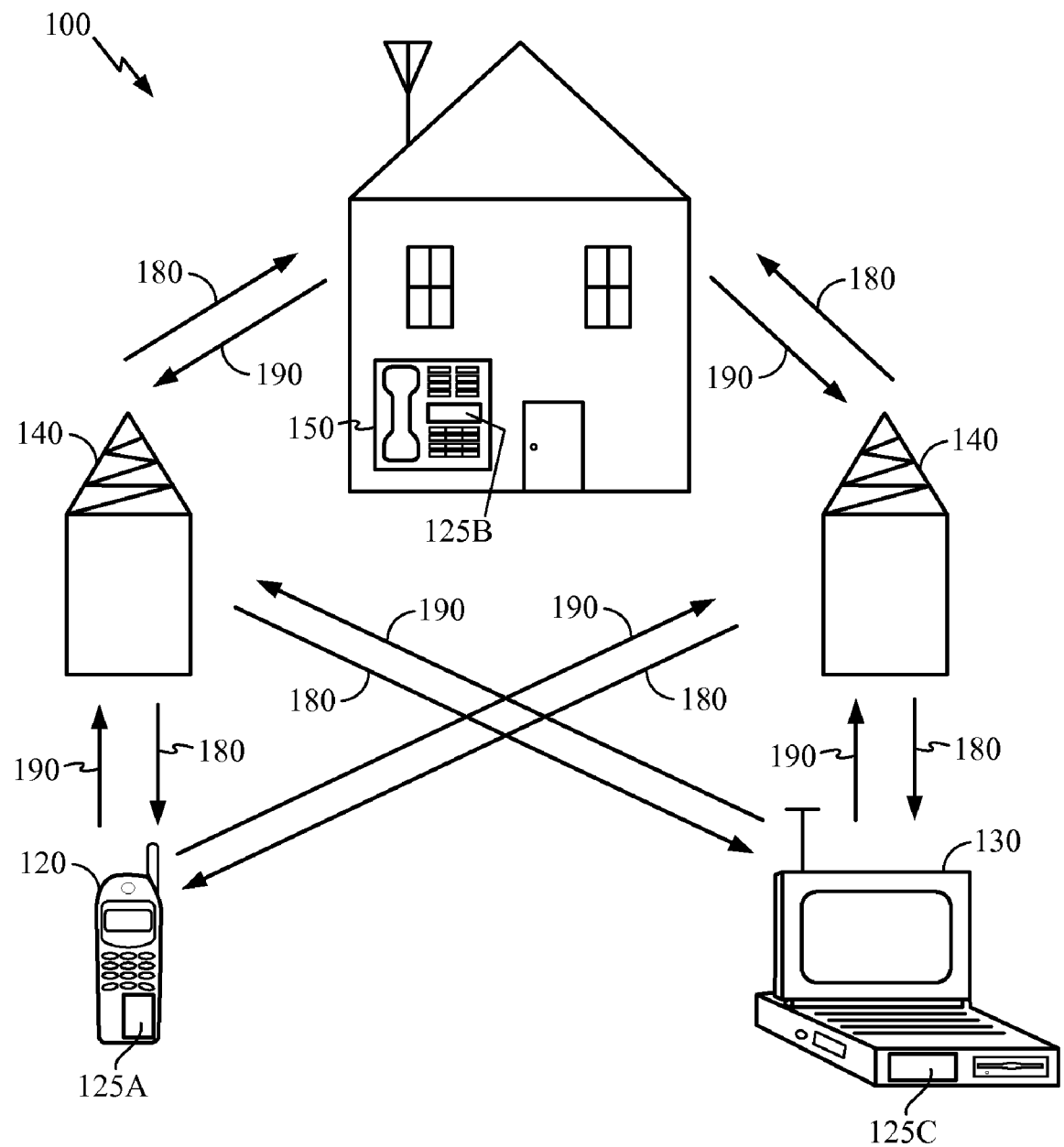
FIG. 1 is a block diagram showing an exemplary wireless communication system.

In FIG. 1, remote unit 120 is shown as a mobile telephone, remote unit 130 is shown as a portable computer, and remote unit 150 is shown as a fixed location remote unit in a wireless local loop system. For example, the remote units may be mobile phones, hand-held personal communication systems (PCS) units, portable data units such as personal data assistants, navigation devices (such as GPS enabled devices), set top boxes, music players, video players, entertainment units, fixed location data units such as meter reading equipment, or any other device that stores or retrieves data or computer instructions, or any combination thereof. Although FIG. 1 illustrates remote units according to the teachings of the disclosure, the disclosure is not limited to these exemplary illustrated units. Embodiments of the disclosure may be suitably employed in any device which includes active integrated circuitry.

The foregoing disclosed devices and methods are typically designed and are configured into a hardware description language, such as GDSII and GERBER computer files, stored on a computer readable media. These files are in turn provided to fabrication handlers who fabricate devices based on these files. The resulting products are semiconductor wafers that are then cut into semiconductor die and packaged into a semiconductor chip. The chips are then employed in devices described above.

Figure 2:
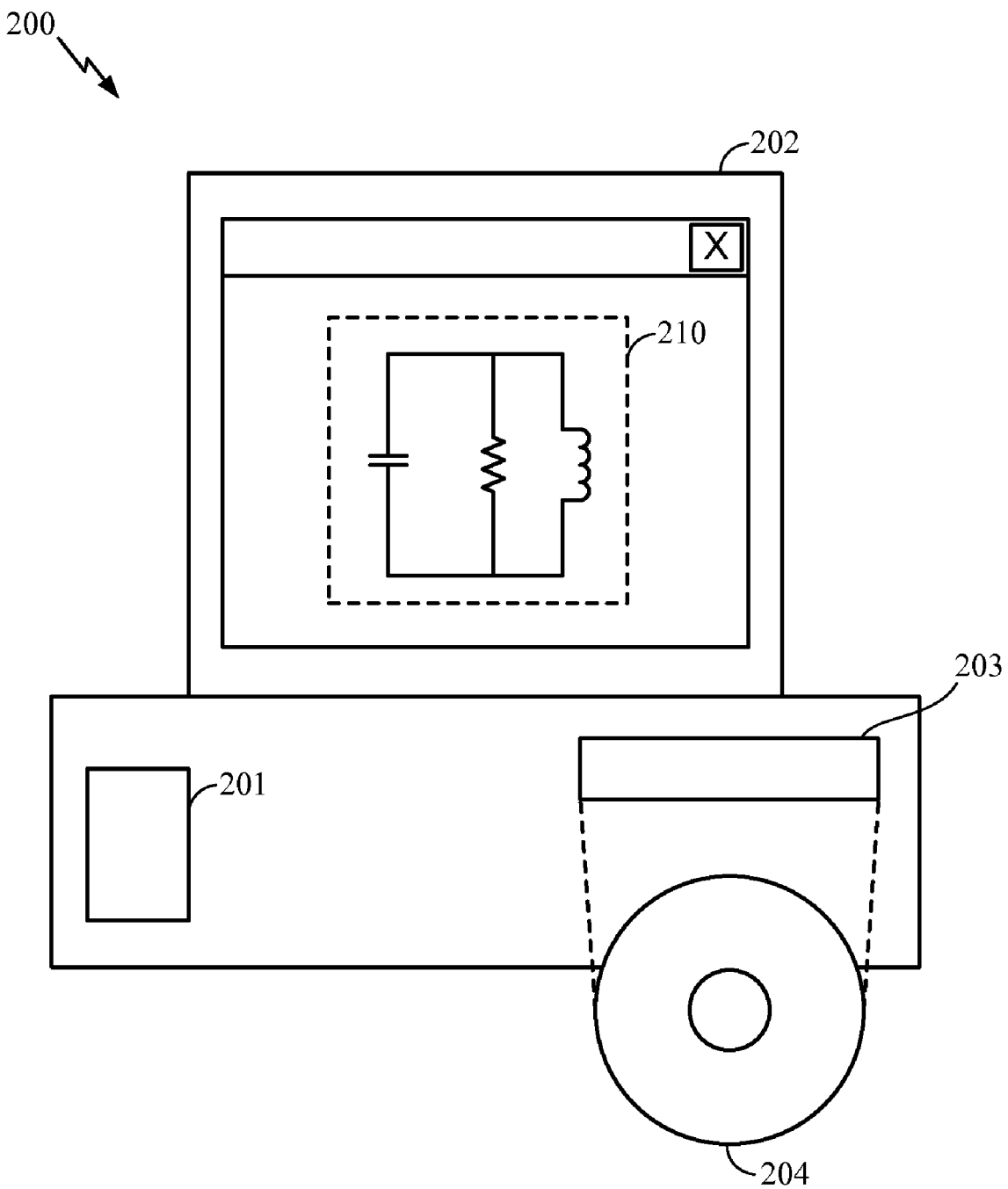
FIG. 2 is a block diagram illustrating a design workstation used for circuit, layout, and logic design of the disclosed semiconductor integrated circuit.

FIG. 2 is a block diagram illustrating a design workstation used for circuit, layout, and logic design of the disclosed semiconductor integrated circuit. A design workstation 200 includes a hard disk 201 containing operating system software, support files, and design software such as Cadence or OrCAD. The design workstation 200 also includes a display to facilitate design of a circuit design 210. The circuit design 210 may be the memory circuit as disclosed above. A storage medium 204 is provided for tangibly storing the circuit design 210. The circuit design 210 may be stored on the storage medium 204 in a file format such as GDSII or GERBER. The storage medium 204 may be a CD-ROM, DVD, hard disk, flash memory, or other appropriate device. Furthermore, the design workstation 200 includes a drive apparatus 203 for accepting input from or writing output to the storage medium 204.

Data recorded on the storage medium 204 may specify logic circuit configurations, pattern data for photolithography masks, or mask pattern data for serial write tools such as electron beam lithography. The data may further include logic verification data such as timing diagrams or net circuits associated with logic simulations. Providing data on the storage medium 204 facilitates the design of the circuit design 210 by decreasing the number of processes for designing semiconductor ICs.

Figure 3:
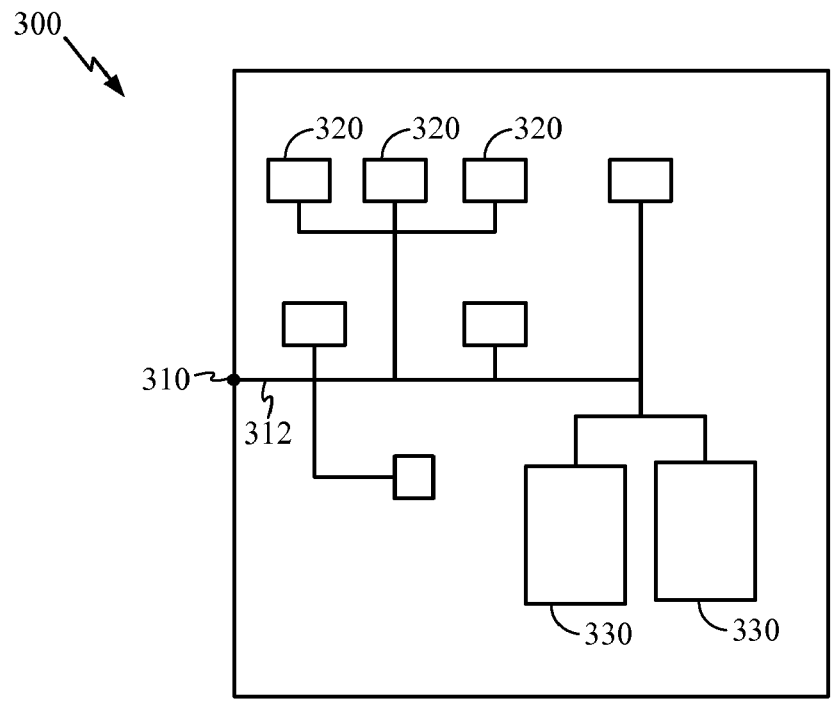
FIG. 3 is a block diagram illustrating a conventional clock tree in an ASIC design.

FIG. 3 is a block diagram illustrating a conventional clock tree in an ASIC design. An ASIC design 300 includes a clock root 310. Branching from the clock root 310 is a clock tree 312. The clock tree 312 may be a wire or interconnect that is coupled to one or more cells in the ASIC design 300 such as register cells 320 and memory cells 330. The cells 320, 330 are leaves of the clock tree 312. The ASIC design 300 may be, for example, a design for personal data assistants, navigation devices (such as GPS enabled devices), set top boxes, music players, video players, entertainment units, fixed location data units such as meter reading equipment, or any other device that stores or retrieves data or computer instructions, or any combination thereof.

As discussed above, the distance between the clock root 310 and the cells 320, 330 are different for each of the cells 320, 330. As a result, each cell 320, 330 experiences different insertion delays because of the propagation time difference to each cell. Additionally, the clock is skewed such that the time a clock signal needs to transition from a low state to a high state is longer. The skew results from capacitance of the wires or interconnects making up the clock tree 312.

Figure 4:
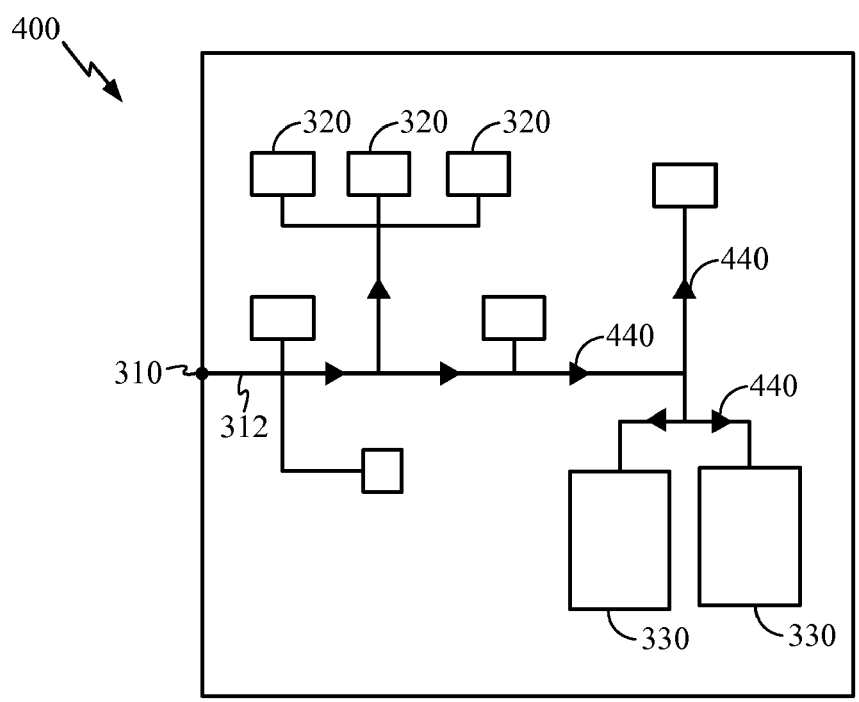
FIG. 4 is a block diagram illustrating a conventional clock tree in an ASIC design with buffers.
Figure 3:
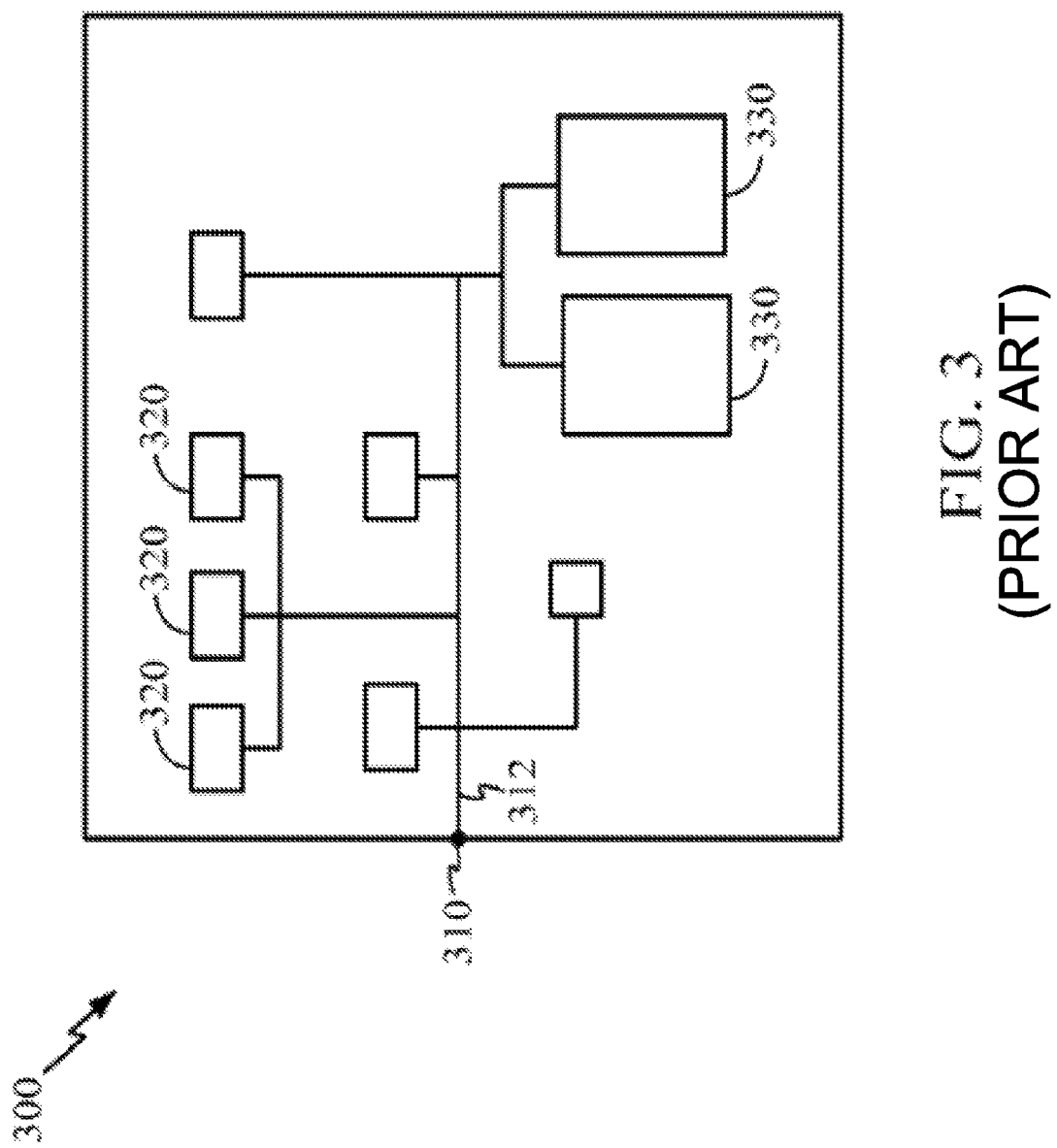

Conventional synthesis tools place buffers along the clock tree 312 to decrease clock skew and delay the clock signal such that the insertion delay to each of the cells 320, 330 is similar. Referring now to FIG. 4, a block diagram illustrating a conventional clock tree in an ASIC design with buffers placed by a conventional synthesis tool is described below. An ASIC design 400 includes the clock root 310 coupled to the clock tree 312. The clock tree 312 is coupled to the register cells 320 and the memory cells 330. Furthermore, buffers 440 are placed along the clock tree 312 according to a synthesis tool. The buffers 440 are designed to reduce clock skew and ensure similar clock arrival time of all the cells 320, 330.

Figure 5:
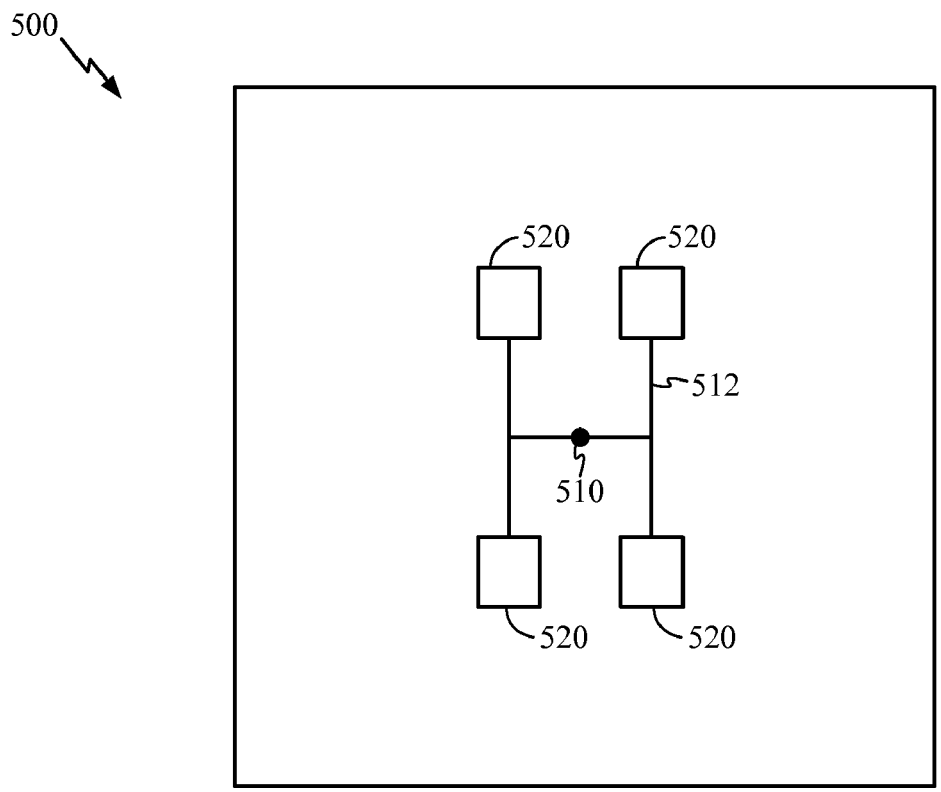
FIG. 5 is a block diagram illustrating one level of an exemplary H-tree ASIC design according to one embodiment.

According to one embodiment of the present disclosure, ASICs may be designed using a synthesis tool that couples levels of Hs such that the distance from a clock root to each cell of the ASIC is equal. Such an ASIC design is referred to as an H-tree. The equal distance to each cell is a result of symmetry in the H-tree structure and results in a substantially equal insertion delay to each cell in the ASIC design. Turning now to FIG. 5 an example of a single level H-tree will be described.

FIG. 5 is a block diagram illustrating one level of an exemplary H-tree ASIC design according to one embodiment. An ASIC design 500 includes an anchor H 512. The anchor H 512 includes a buffer 510 at its center that also serves as a clock root. Cells 520 are leaves on the anchor H 512. The cells 520 may be, for example, register cells or memory cells. The ASIC design 500 is symmetric because the shape of the anchor H 512 is symmetric. As a result, the path length to each cell 520 is substantially equal.

Figure 6:
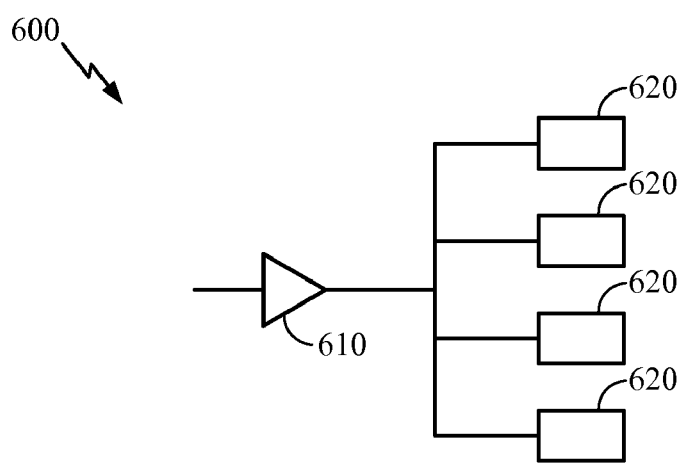
FIG. 6 is a circuit diagram illustrating the equivalent circuit to the ASIC design of FIG. 5.

To further illustrate the symmetric nature of the H-tree, an equivalent circuit is shown. FIG. 6 is a circuit diagram illustrating the equivalent circuit to the ASIC design 500. A circuit 600 includes a buffer 610. The buffer 610 corresponds to the buffer 510 located at the center of the anchor H 512. Coupled to the buffer 610 are cells 620. The cells 620 correspond to the cells 520 coupled to the edges of the anchor H 512. The circuit 600 may be converted to a net list by a synthesis tool.

Figure 7:
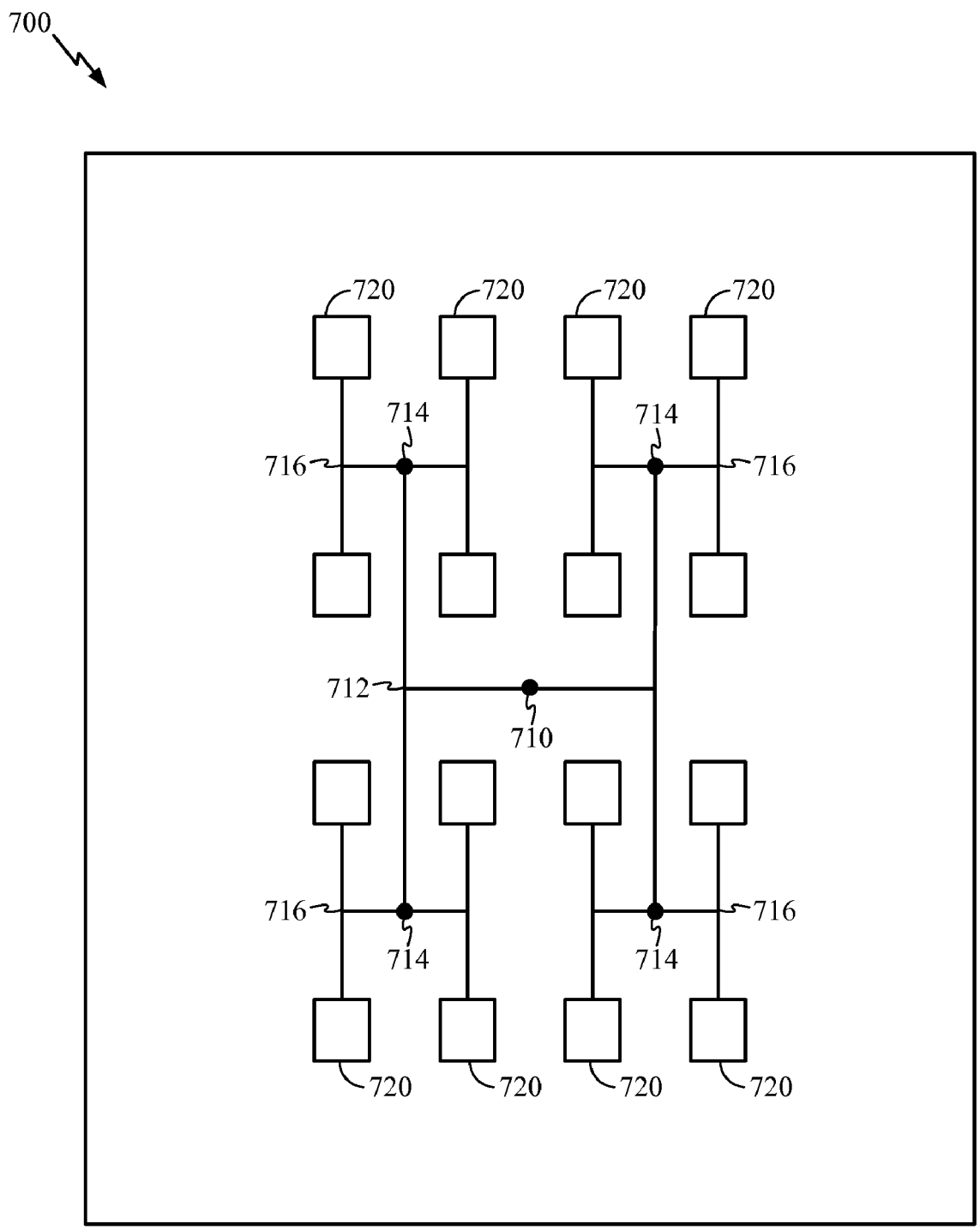
FIG. 7 is a block diagram illustrating two levels of an exemplary H-tree ASIC design according to one embodiment.

FIGS. 5 and 6 illustrate only one level of an H-tree ASIC design. Multiple layers may be built by attaching child Hs to the edges of the anchor H 512. A synthesis tool may build a multiple level H-tree, according to one embodiment, using a recursive algorithm. Turning now to FIG. 7 an example of a multiple level H-tree will be described.

The H-tree may be further expanded to include multiple levels such as shown in the embodiment of FIG. 7. FIG. 7 is a block diagram illustrating two levels of an exemplary H-tree ASIC design according to one embodiment. An ASIC design 700 includes an anchor H 712. Located at the center of the anchor H 712 is a buffer 710 that serves as a clock root. Coupled to the edges of the anchor H 712 are several child Hs 716. At the center of each child H 716 is a buffer 714. Coupled to the edges of child Hs 716 are cells 720. The cells 720 may be, for example, register cells or memory cells. The ASIC design 700 is symmetrical because both the anchor H 712 and the child Hs 716 are symmetrical.

A fan-out of the anchor H 712 describes the ASIC design 700. As shown in FIG. 7, the cells 720 occupy all edges of the child Hs 716 in equal numbers. The fan-out of the anchor H 712 has equal weight on each of the child Hs 716. Having equal weight contributes to the symmetrical nature of the ASIC design 700.

The symmetrical nature of each level of the H-tree will be illustrated using an equivalent circuit. Additionally, the equivalent circuit will demonstrate that each buffer in the H-tree design has a substantially equal load according to one embodiment of the disclosure. However, it is not necessary that each of the child Hs 716 has the same number of cells coupled to the child Hs 716.

The number of levels of the child Hs 716 is determined, according to one embodiment, by a rounded down integer equal to a binary logarithm of a quotient of the starting segment length divided by the ending length. The anchor H 712 has a size equal to the starting segment length. Each child H 716 coupled to the anchor H 712 has a size equal to half of the starting segment length. Each level of child H 716 has a size equal to half of the size of the level before. This process continues until the size is equal to the end segment length or halving the size would result in a smaller size than the end segment length. The starting segment length and ending segment length may be input by the user into a clock tree synthesis tool.

The task of creating an H-tree as shown in FIG. 7 may be divided into simple functions. According to one embodiment the functions may be divided as follows. A get bounding box function locates the bounding box for the ASIC design. A trace function recursively traverses an H-tree to place cells and draw wires. A draw function draws an H element in the H-tree. A create cell function creates a cell based on a chosen model. A place cell function places a created cell at a specified location. A connect cgc function connects leaves of an H-tree to a closest clock gating cell. A parent child link function finds children of the H-tree by storing coordinates of H elements and segment lengths. A connect parent child function connects identified H elements to child H elements in an H-tree. A go leaf connect function connects all child Hs to clock gating cells.

Figure 8:
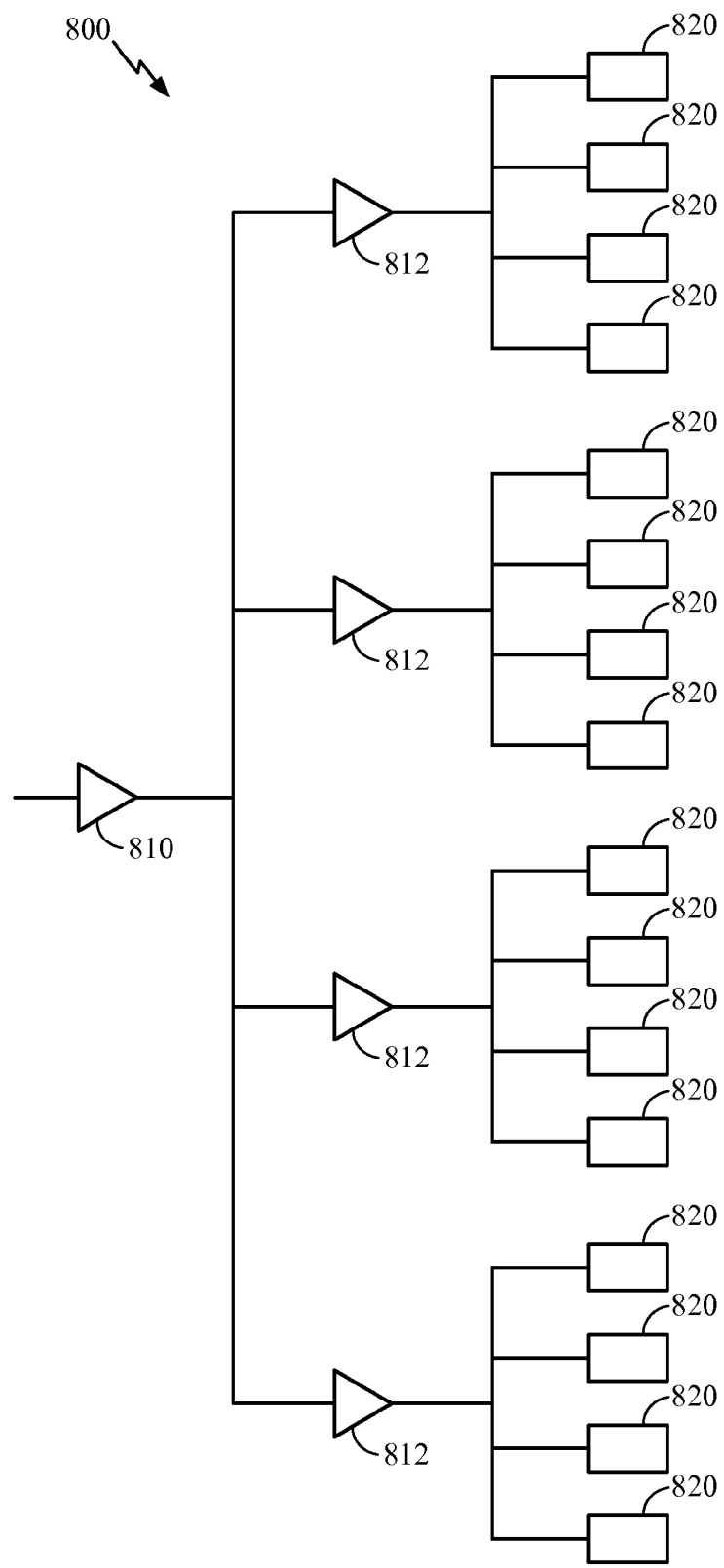
FIG. 8 is a circuit diagram illustrating the equivalent circuit to the ASIC design of FIG. 7.

FIG. 8 is a circuit diagram illustrating an equivalent circuit to the ASIC design 700. A circuit 800 includes a buffer 810 corresponding to the buffer 710 at the center of the anchor H 712. Coupled to the buffer 810 are buffers 812 corresponding to the buffers 714 at the center of the child Hs 716. The buffers 812 are coupled to cells 820. The cells 820 correspond to the cells 720 coupled to the child Hs 716. The circuit 800 may be converted to a net list for use in further designing ASICs for use in personal data assistants, navigation devices (such as GPS enabled devices), set top boxes, music players, video players, entertainment units, fixed location data units such as meter reading equipment, or any other device that stores or retrieves data or computer instructions, or any combination thereof. Additionally, the cells 720 may be coupled to clock gating cells.

FIGS. 7 and 8 illustrate a two level H-tree according to one embodiment of the present disclosure. However, additional layers may be added to the H-tree in a similar fashion by traversing the H-tree recursively and placing additional child Hs on the child Hs 716. This may be done repeatedly, according to one embodiment, until an H-tree is large enough to support each of the cells 720. According to another embodiment, the recursive function may be repeated until input parameters chosen by a designer are satisfied. The resulting H-tree produces equal insertion delays at each of the cells 720.

Figure 9:
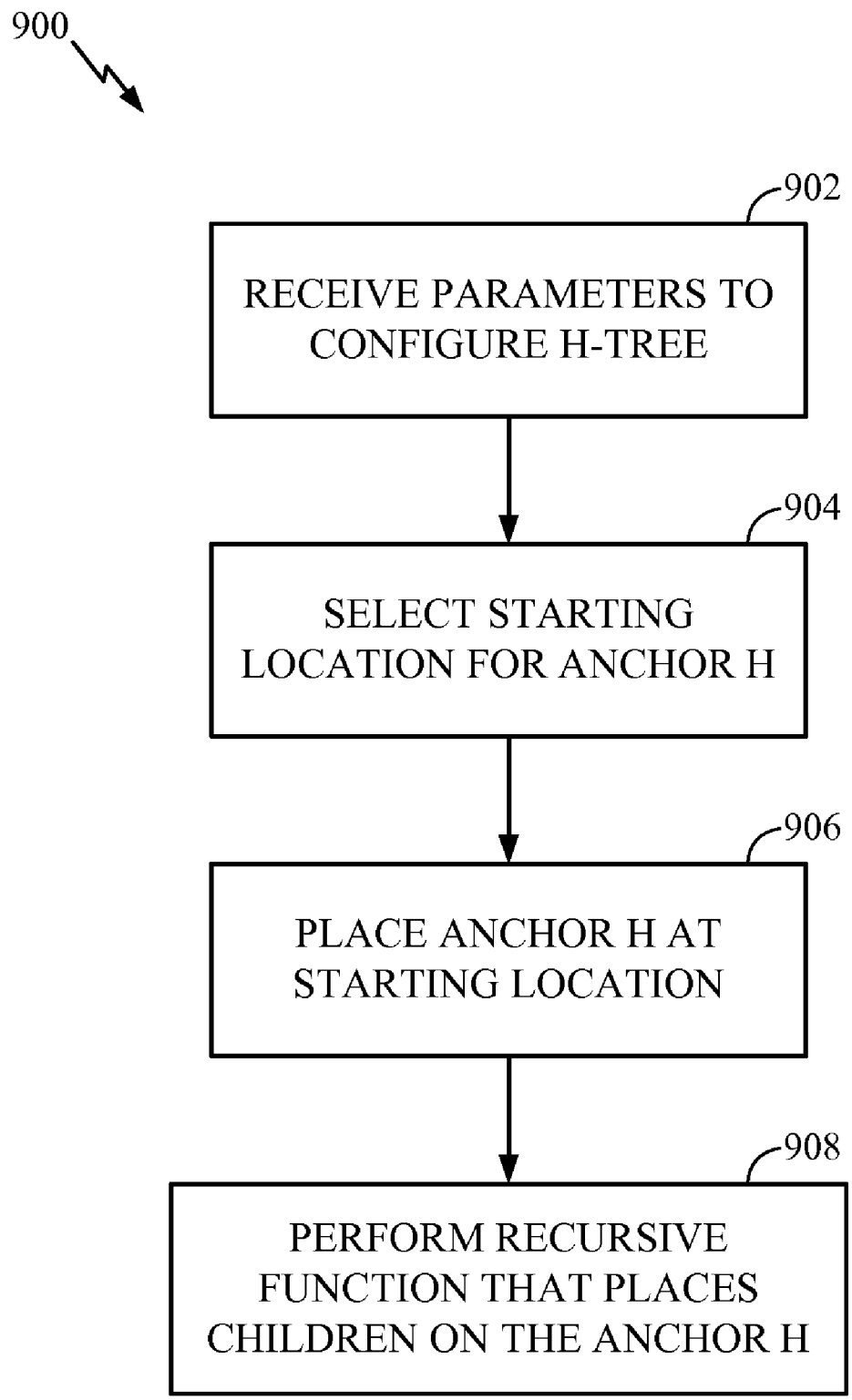
FIG. 9 is a flowchart illustrating the process for generating an H-tree design according to one embodiment.

FIG. 9 is a flowchart illustrating the process for generating an H-tree design according to one embodiment. A method 900 for generating an H-tree begins at a block 902. The method 900 receives parameters to configure an H-tree. These parameters may include, for example, a starting segment length, an ending segment length, and a buffer type. The method 900 proceeds to block 904 where a starting location for the anchor H is chosen. Alternatively, according to another embodiment, the starting location may be received from a designer as a parameter configuring the H-tree. Continuing to block 906, an anchor H is placed at the starting location selected at block 904. The method 900 continues to block 908 where a recursive function is executed that places children on the anchor H from block 906 to form an H-tree. Cells may then be placed on the children of block 908. According to another embodiment the cells may be placed immediately on the anchor H of block 906.

The H-tree synthesis tool described above discusses the placing of Hs, wires, interconnects, buffers, and clock gating cells, however, the synthesis tool may also be used to arrange memory and register cells in the ASIC. The cells may be arranged according to one embodiment such that the cells are coupled to edges of Hs in an H-tree.

Although specific circuitry has been set forth, it will be appreciated by those skilled in the art that not all of the disclosed circuitry is required to practice the invention. Moreover, certain well known circuits have not been described so as to maintain focus on the invention.

Although the present invention and its advantages have been described in detail, it should be understood that various changes, substitutions, and alterations can be made herein without departing from the technology of the invention as defined by the appended claims. Moreover, the scope of the present application is not intended to be limited to the particular embodiments of the process, machine, manufacture, composition of matter, means, methods, and steps described in the specification. As one of ordinary skill in the art will readily appreciate from the disclosure, processes, machines, manufacture, compositions of matter, means, methods, or steps, presently existing or later to be developed that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A non-transitory computer readable medium, having stored thereon a computer program, which executed by a computer, causes the computer to implement a method of generating an H-tree for an integrated circuit design, the computer program comprising:
    code to receive from a user a set of parameters to configure the H-tree, the set of parameters comprising a starting segment length and an ending segment length, the starting and ending segment lengths defining lengths of all interconnects for the integrated circuit design;
    code to select a starting location in the integrated circuit design, the starting location defining a clock root for the integrated circuit design; and
    code to place an anchor H defined by anchor interconnects having the starting segment length, the anchor interconnects forming paths from the starting location to child Hs or cells of the integrated circuit design, all interconnects being configured to propagate a clock signal from the starting location to the cells.

2. The non-transitory computer readable medium of claim 1, further comprising code to recursively place child Hs on the H-tree based on the starting segment length and the ending segment length to create a fan-out with equal weight on each child H.

3. The non-transitory computer readable medium of claim 2, further comprising code for calculating a number of levels of child Hs of the H-tree according to a rounded down integer equal to a binary logarithm of a quotient of the starting segment length divided by the ending length.

4. The non-transitory computer readable medium of claim 2, in which the set of parameters to configure the H-tree further comprises a clock buffer type.

5. The non-transitory computer readable medium of claim 4, further comprising code for placing a buffer of the clock buffer type at a center of the anchor H and centers of the child Hs.

6. The non-transitory computer readable medium of claim 2, further comprising code for generating a net list for the H-tree.

7. The non-transitory computer readable medium of claim 1, further comprising code for integrating the H-tree into a device selected from a group consisting of a music player, a video player, an entertainment unit, a navigation device, a communications device, a personal digital assistant (PDA), a fixed location data unit, and a computer.

8. A computerized method of generating an H-tree for an integrated circuit, comprising:
    using a computer to perform the following:
    receiving from a user a set of parameters to configure the H-tree, the parameters comprising a starting segment length and an ending segment length, the starting and ending segment lengths defining lengths of all interconnects for the integrated circuit design;
    placing an anchor H defined by anchor interconnects forming paths from a starting location according to the starting segment length, all interconnects being configured to propagate a clock signal to cells of the integrated circuit design from the starting location, the starting location defining a clock root for the integrated circuit design; and
    recursively placing child Hs according to the starting segment length and ending segment length to create a fan-out with equal weight on each child H.

9. The computerized method of claim 8, further comprising calculating a number of levels of child Hs according to the starting segment length divided by a multiple of four times the ending segment length.

10. The computerized method of claim 8, further comprising coupling the H-tree to application specific integrated circuit (ASIC) cells.

11. The computerized method of claim 8, in which the set of parameters to configure the H-tree further comprises a clock buffer type.

12. The computerized method of claim 11, further comprising placing a buffer of the clock buffer type at a center of the anchor H and centers of the child Hs.

13. The computerized method of claim 12, further comprising generating a net list for the H-tree.

14. The computerized method of claim 8, further comprising integrating a circuit design based upon the H-tree into a device selected from a group consisting of a music player, a video player, an entertainment unit, a navigation device, a communications device, a personal digital assistant (PDA), a fixed location data unit, and a computer.

15. A computerized method of generating an H-tree for an integrated circuit, comprising the steps for:
    receiving from a user a set of parameters to configure the H-tree, the parameters comprising a starting segment length and an ending segment length, the starting and ending segment lengths defining lengths of all interconnects for the integrated circuit design;

placing an anchor H defined by anchor interconnects forming paths from a starting location according to the starting segment length, all interconnects being configured to propagate a clock signal to cells of the integrated circuit design from the starting location, the starting location defining a clock root for the integrated circuit design; and recursively placing child Hs according to the starting segment length and ending segment length to create a fan-out with equal weight on each child H.

16. The computerized method of claim 15, further comprising the step for calculating a number of levels of child Hs according to the starting segment length divided by a multiple of four times the ending segment length.

17. The computerized method of claim 15, further comprising the step for coupling the H-tree to application specific integrated circuit (ASIC) cells.

18. The computerized method of claim 15, in which the set of parameters to configure the H-tree further comprises a clock buffer type.

19. The computerized method of claim 18, further comprising the step for placing a buffer of the clock buffer type at a center of the anchor H and centers of the child Hs.

20. The computerized method of claim 15, further comprising the step for integrating a circuit design based upon the H-tree into a device selected from a group consisting of a music player, a video player, an entertainment unit, a navigation device, a communications device, a personal digital assistant (PDA), a fixed location data unit, and a computer.

21. An apparatus for generating an H-tree for an integrated circuit, comprising:

means for receiving from a user a set of parameters to configure the H-tree, the parameters comprising a starting segment length and an ending segment length, the starting and ending segment lengths defining lengths of all interconnects for the integrated circuit design;

means for placing an anchor H defined by anchor interconnects forming paths from a starting location according to the starting segment length, all interconnects being configured to propagate a clock signal to cells of the integrated circuit design from the starting location, the starting location defining a clock root for the integrated circuit design; and means for recursively placing child Hs according to the starting segment length and ending segment length to create a fan-out with equal weight on each child H.

22. The apparatus of claim 21, in which the integrated circuit design based upon the H-tree is integrated into a device selected from a group consisting of a music player, a video player, an entertainment unit, a navigation device, a communications device, a personal digital assistant (PDA), a fixed location data unit, and a computer.

23. An apparatus to implement a method of generating an H-tree for an integrated circuit design, comprising:

means for receiving from a user a set of parameters to configure the H-tree, the set of parameters comprising a starting segment length and an ending segment length, the starting and ending segment lengths defining lengths of all interconnects for the integrated circuit design;

means for selecting a starting location in the integrated circuit design, the starting location defining a clock root for the integrated circuit design; and means for placing an anchor H defined by anchor interconnects having the starting segment length, the anchor interconnects forming paths from the starting location to child Hs or cells of the integrated circuit design, all interconnects being configured to propagate a clock signal from the starting location to the cells.

24. The apparatus of claim 23, in which the integrated circuit design based upon the H-tree is integrated into a device selected from a group consisting of a music player, a video player, an entertainment unit, a navigation device, a communications device, a personal digital assistant (PDA), a fixed location data unit, and a computer.

25. A computerized method to generate an H-tree for an integrated circuit design, the method comprising:

using a computer to perform the following:

receiving from a user a set of parameters to configure the H-tree, the set of parameters comprising a starting segment length and an ending segment length, the starting and ending segment lengths defining lengths of all interconnects for the integrated circuit design;

selecting a starting location in the integrated circuit design, the starting location defining a clock root for the integrated circuit design; and placing an anchor H defined by anchor interconnects having the starting segment length, the anchor interconnects forming paths from the starting location to child Hs or cells of the integrated circuit design, all interconnects being configured to propagate a clock signal from the starting location to the cells.

26. The method of claim 25, further comprising integrating the circuit design based upon the H-tree into a device selected from a group consisting of a music player, a video player, an entertainment unit, a navigation device, a communications device, a personal digital assistant (PDA), a fixed location data unit, and a computer.

* * * * *